US007336794B2

(12) United States Patent
Fürst et al.

(10) Patent No.: US 7,336,794 B2
(45) Date of Patent: Feb. 26, 2008

(54) HIGH EFFICIENCY DRIVER FOR MINIATURE LOUDSPEAKERS

(75) Inventors: Claus Erdmann Fürst, Roskilde (DK); Lars Jorn Stenberg, Roskilde (DK); Jens Kristian Poulsen, Hedehusene (DK); Henrik Thomsen, Søborg (DK)

(73) Assignee: Sonion A/S, Roskilde (DK)

( * ) Notice: Subject to any disclaimer, the term of this patent is extended or adjusted under 35 U.S.C. 154(b) by 1103 days.

(21) Appl. No.: 10/307,290

(22) Filed: Dec. 2, 2002

(65) Prior Publication Data

US 2003/0123681 A1 Jul. 3, 2003

(51) Int. Cl.
*H04R 3/00* (2006.01)
*H03F 3/38* (2006.01)

(52) U.S. Cl. .......................... 381/117; 381/111; 330/10

(58) Field of Classification Search ................ 381/111, 381/117, 116; 330/10, 207 A, 251
See application file for complete search history.

(56) References Cited

U.S. PATENT DOCUMENTS

| | | | | |
|---|---|---|---|---|
| 5,077,539 | A | 12/1991 | Howatt | 330/10 |
| 5,617,058 | A | 4/1997 | Adrian et al. | 330/10 |
| 5,777,512 | A | 7/1998 | Tripathi et al. | 330/207 |
| 5,815,102 | A | 9/1998 | Melanson | 341/143 |
| 5,815,581 | A | 9/1998 | Andersson | 381/68.4 |
| 6,191,650 | B1 | 2/2001 | Backram et al. | 330/10 |
| 6,297,692 | B1 | 10/2001 | Nielsen | 330/10 |
| 6,362,702 | B1 | 3/2002 | Nielsen et al. | 332/149 |
| 6,408,318 | B1 | 6/2002 | Fang et al. | 708/313 |
| 6,472,933 | B2 * | 10/2002 | Hsu | 330/10 |
| 6,791,404 | B1 * | 9/2004 | Olson et al. | 330/10 |
| 6,867,722 | B2 * | 3/2005 | Hochschild | 341/146 |
| 6,933,778 | B2 * | 8/2005 | Olson et al. | 330/10 |
| 2002/0075068 | A1 | 6/2002 | Hsu | 330/10 |
| 2003/0081803 | A1 * | 5/2003 | Petilli et al. | 381/314 |

FOREIGN PATENT DOCUMENTS

| | | | |
|---|---|---|---|
| DE | 4441996 | A1 | 5/1996 |
| WO | WO 01/03303 | A3 | 1/2001 |
| WO | WO 02/25817 | A1 | 3/2002 |

OTHER PUBLICATIONS

"Analog Processing Circuits for a 1.1V, 270uA Mixed Signal Hearing Aid Chip" ISSCC2002 in San Francisco in Feb. 2002.
"Gennembrud for digital forstaerkerteknologi" published in Nyhedsmagasinet Elektronik & Data, No. 5, 2002 (accompanied by English abstract).
Search Report.

* cited by examiner

*Primary Examiner*—Xu Mei
(74) *Attorney, Agent, or Firm*—Harness, Dickey & Pierce, P.L.C.

(57) ABSTRACT

In a first aspect the present invention provides a compact high efficiency driver suitable for driving a loudspeaker, such as a miniature loudspeaker for mobile phones or hearing aids. The driver comprising an interface for receiving an input signal, a three-level modulator, and a three-level H-bridge. The interface may be adapted to receive a digital input signal. In a preferred embodiment of the driver the H-bridge is controlled by a correction circuit which is operated by a Return-To-Zero scheme. In a further preferred embodiment the driver comprises a supply voltage step-up circuit for increasing a voltage supplied to the H-bridge. In a second aspect the present invention provides a miniature loudspeaker assembly having a built-in driver. In a third aspect the present invention provides a mobile device with a built-in miniature loudspeaker assembly.

12 Claims, 2 Drawing Sheets

HIGH EFFICIENCY DRIVER FOR MINIATURE LOUDSPEAKERS

FIELD OF THE INVENTION

The present invention relates to a driver for an acoustical miniature transducer. In particular, the present invention relates to a loudspeaker driver providing high efficiency. In addition, the present invention relates to a miniature loudspeaker assembly having a built-in driver.

BACKGROUND OF THE INVENTION

Miniature loudspeakers are widely used in a variety of small portable devices, such as mobile phones, music players, personal digital assistants, hearing aids, earphones, portable ultrasonic equipment, and so forth, where small dimensions are paramount. Users of such devices appreciate their small dimensions, but would prefer not to compromise regarding sound quality. However, these devices are typically battery operated, which further limits the amount of electrical power available to drive the miniature loudspeaker. Also the fact that many of these applications are very sensitive to price dictates that production costs should be very low. Very often the life cycle of such products is very short, thus the design time of new products should be very short.

Today many of these miniature loudspeakers are driven by analog class A/B amplifiers connected to the loudspeaker with external connections. These analog class A/B amplifiers are bulky, inefficient, costly etc. Even further, there are many constraints if one wants to standardise their usage, i.e. interface etc.

Electro-Magnetic Interference (EMI) is becoming an even more increasing problem within microelectronics, thus causing problems with poor noise performance. This calls for solutions suited for integration of the loudspeaker driver into the miniature loudspeaker. By integrating the active signal processing circuit into the miniature loudspeaker casing, the circuit can effectively be shielded against EMI. Thus, there is a need for a digital driver which can be implemented with minimum physical size without decreasing the performance of the driver. Furthermore, such drivers must be suited for low cost production.

The most natural solution is to replace the analog amplifiers with digital driver circuits which can be made highly efficient, fairly small, and with very high quality. Furthermore, when using digital driver circuits, standard digital interface is very easily implemented.

Several solutions on the issue of replacing power amplifiers with digital driver circuits already exist in numerous prior art documents. Examples of such documents are: U.S. Pat. No. 5,077,539 from Apogee Technology, and U.S. Pat. No. 5,777,512 from Tripath Technology, and U.S. 2002/0075068 A1 from Wei-Chan HSU.

The above-mentioned documents aim at applications with power levels of several Watts, such as Hi-Fi sound quality systems. Furthermore, these solutions are quite complex, and they often require many external components thus being too costly to implement in high volume low cost applications. Furthermore, if the driver circuit is to be integrated into the miniature loudspeaker then it is of paramount importance that the physical size of the circuit including external components is as small as possible. None of the above mentioned solutions fulfils this criteria.

U.S. Pat. No. 5,815,581 from Mitel Semiconductor and U.S. Pat. No. 6,191,650 from G/N Netcom describe drivers for hearing aids comprising class D amplifiers in combination with Pulse Width Modulation (PWM). Both of these solutions feature feedback loops for minimizing distortion. Since the inventions described in U.S. Pat. No. 5,815,581 and U.S. Pat. No. 6,191,650 are intended for use within hearing aids, they are suited for miniature applications. However, the circuit structures are rather complex, and thus not suited for low cost production.

Several of the above-mentioned prior art documents describe three-level sigma-delta modulation based drivers or amplifiers, which offer superior efficiency compared to two level (1-bit) sigma-delta modulation systems. Normally, a three-level driver is combined with PWM.

DE 44 41 996 A1 describes a two-level Pulse Density Modulation (PDM) driver for hearing aids. PWM is more complicated to implement but can be operated at a lower clock frequency than PDM, which is an advantage as the H-bridge converts the digital signal into an analog output signal with less error if the clock frequency is lower. The lower complexity of the PDM is very attractive for high volume applications, as the lower complexity will result in lower production cost. However, it is generally known that PDM implementations require a very high clock frequency which has disadvantages such as distortion due to switching rise and fall times, and if standard components are used switching loss will result in decreased efficiency.

Thus, there is a need for a miniature loudspeaker driver offering high efficiency, small dimensions, is suited for low cost production, and still with high quality performance regarding Signal-to-Noise-Ratio (SNR) and distortion.

It is an object of the present invention to provide a driver for digitally converting a signal into a modulated signal with the lowest possible clock frequency, the lowest complexity, and still achieving good performance.

It is a further object of the present invention to combine the driver with a miniature loudspeaker in a complete system thus achieving the smallest possible size, thereby making the system suitable for applications with very limited space available.

It is a still further object of the present invention to provide a miniature loudspeaker assembly with minimal emission of EMI due to the integrated, shielded and dense nature of a miniature assembly also leading to a low susceptibility to EMI.

SUMMARY OF THE INVENTION

The above mentioned objects are complied with by providing, in a first aspect, a driver suitable for driving a loudspeaker, the driver comprising an interface adapted to receive an input signal, a three-level modulator, and a three-level H-bridge. The interface may be adapted to receive an input signal. The input signal may be an analog or digital. The three-level modulator may be implemented in the analog or in the digital domain. The interface may be adapted for receiving and processing signal formats selected from the group consisting of: SPDIF, AES/EBU, PCM, SSI and $I^2S$. In a preferred embodiment the driver further comprising an interpolator. In another preferred embodiment of the driver the three-level modulator comprises a three-level sigma-delta modulator. The driver may further comprise a power supply voltage regulator. The driver may further comprise a PLL (Phase Locked Loop). In a preferred embodiment the H-bridge is controlled by a correction circuit. The correction circuit may be operated according to a RTZ (Return-To-Zero) scheme. The RTZ scheme may be level dependent. The correction circuit may comprise a digital filter, the digital filter may be a $1+Z^{-1}$ filter. The correction circuit may further comprise a pattern generator. The correction circuit may comprise means for providing a feedback signal, and the correction circuit may comprise means for providing pseudo multibit coding. The three-level H-bridge may comprise at least 4 switches for providing independent control.

The driver may further comprise a filter having its input terminal connected to an output terminal of the driver. The filter may comprise a low-pass filter section, and the filter may comprise a coil. The driver may further comprise a power supply step-up circuit for increasing a level of supply voltage supplied to the three-level H-bridge.

In a second aspect, the present invention relates to a miniature loudspeaker assembly adapted to convert a first electrical signal to an acoustical signal, the miniature loudspeaker assembly comprising

- a driver according to the first aspect, the driver being adapted to receive the first electrical signal and to generate a modified first electrical signal in response to the first electrical signal, and
- a loudspeaker comprising a motor adapted to receive the modified first electrical signal, the motor further being adapted to drive a diaphragm so as to generate the acoustical signal.

The miniature loudspeaker assembly may further comprise a control circuit, the control circuit being electrically connected between the driver and the motor. The motor may comprise a coil and a magnetic circuit. The motor may comprise a piezo element. The control circuit may be adapted to charge and to discharge the piezo element. Charging and discharging may be performed by switching a coil between the piezo element and a voltage supply. Charging and discharging may be performed by switching a capacitor between the piezo element and a voltage supply. The driver may be positioned in a casing fabricated in an EMI shielding material.

In a third aspect, the present invention relates to a mobile device comprising a miniature loudspeaker assembly according to the second aspect. The mobile device may be selected from the group consisting of: mobile phones, hearing aids, assistive listening devices, head-sets, palm computers, and laptop computers.

BRIEF DESCRIPTION OF THE DRAWINGS

The present invention will now be explained in further details with reference to the accompanying figure, where.

Figure 1:
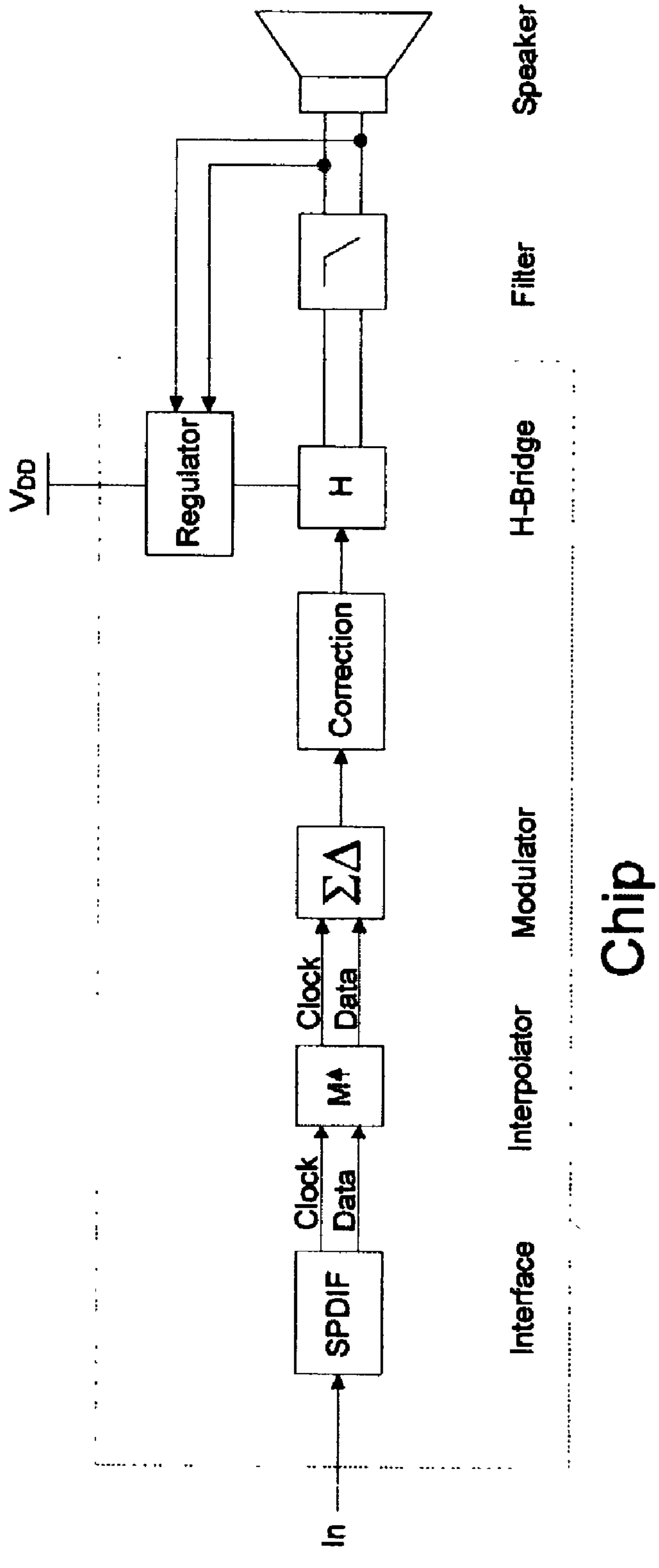
FIG. 1 shows an example of a block diagram of a loudspeaker driver according to the invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In FIG. 1, an example of a block diagram of a loudspeaker driver according to the present invention is depicted. Only the most commonly used signal processing blocks are shown. As the active signal processing circuit is mainly digital it is very easy to add additional functionalities. This could for example be a volume control, PLL filters etc. The input signal is a digital signal. Preferably, the parts are implemented on a single chip, such as an ASIC (Application Specific Integrated Circuit). Among these parts are a digital interface, an interpolator, a sigma-delta modulator, a regulator and an H-bridge. The correction block facilitates the control of the H-bridge in order to compensate for non-linearities. This block is essential and is described in further details in FIG. 2. In FIG. 1, the output from the chip is connected to the loudspeaker via a low-pass filter for removing high frequency noise caused by the loudspeaker driver. This filter is optional and can be avoided under certain circumstances.

The present invention relates to the principle behind the modulator and its implementation. Furthermore, the present invention relates to specific use of the implementation.

The function of the interface block is to provide a standard interface to the outside world. There exist several digital interface standards, for example: SPDIF, AES/EBU, PCM, SSI and $I^2S$. The interface block typically supplies a clock and a data signal in a format where it can be processed by the interpolator. The function of the interpolator is to make sample rate conversion, such as up-conversion as data normally arrives at a lower clock speed than the clock of the modulator. The modulator has the function of converting the signal quantized in amplitude into a signal quantized in time. The signal now has two (or three) levels. This means that the H-bridge can directly be controlled by the modulator. I.e. the H-bridge is only capable of accepting signals with amplitudes of maximally 3 values.

Basically the H-bridge consists of four switches connected in a so-called bridge which can be controlled independently. These switches connect the loudspeaker to the power supply (VDD) and ground (GND). Thus, it is possible to generate the following voltages across the loudspeaker, −VDD, 0 and VDD. A two level H-bridge is on the other hand restricted to −VDD and VDD. By controlling the switching in time a low frequency signal can then be generated. This can be done by a conversion from an amplitude quantized signal into a signal quantized in time using for example by a time discrete PWM (Pulse Width Modulation) or by a PDM (Pulse Density Modulation) modulation. The PWM or PDM modulated signal contains, besides the wanted low frequency signal, also substantial high frequency noise. This is normally removed by a filter, for example an analog low-pass filter, connected between the output of the H-bridge and the loudspeaker. The filter may also comprise active components.

Thorough analysis shows that three-level sigma-delta modulation reduces the clock frequency needed in order to obtain a given SNR by as much as a factor of two—or consequently improve the SNR dramatically for a given clock frequency thus reducing the need for a very sharp output filter—possibly eliminating the need for an output filter completely. If an electrodynamic loudspeaker is used, the output filter can in most cases be omitted completely, since both the electrical and mechanical response of the loudspeaker will provide a low-pass filtering.

The optimisation of the three-level modulator involves optimizing the noise transfer function of the modulator as well as the levels of the quantizer. The three-level sigma-delta modulation scheme has the big advantage of being of low complexity thus being cheap to implement in for example silicon. Compared to PWM modulation PDM modulation is inherently linear and does not require any correction scheme to correct for a non-linear modulation. The three-level sigma-delta modulator combines the linearity and the low complexity of the PDM modulation scheme with the low clock frequency of the PWM.

Figure 2:
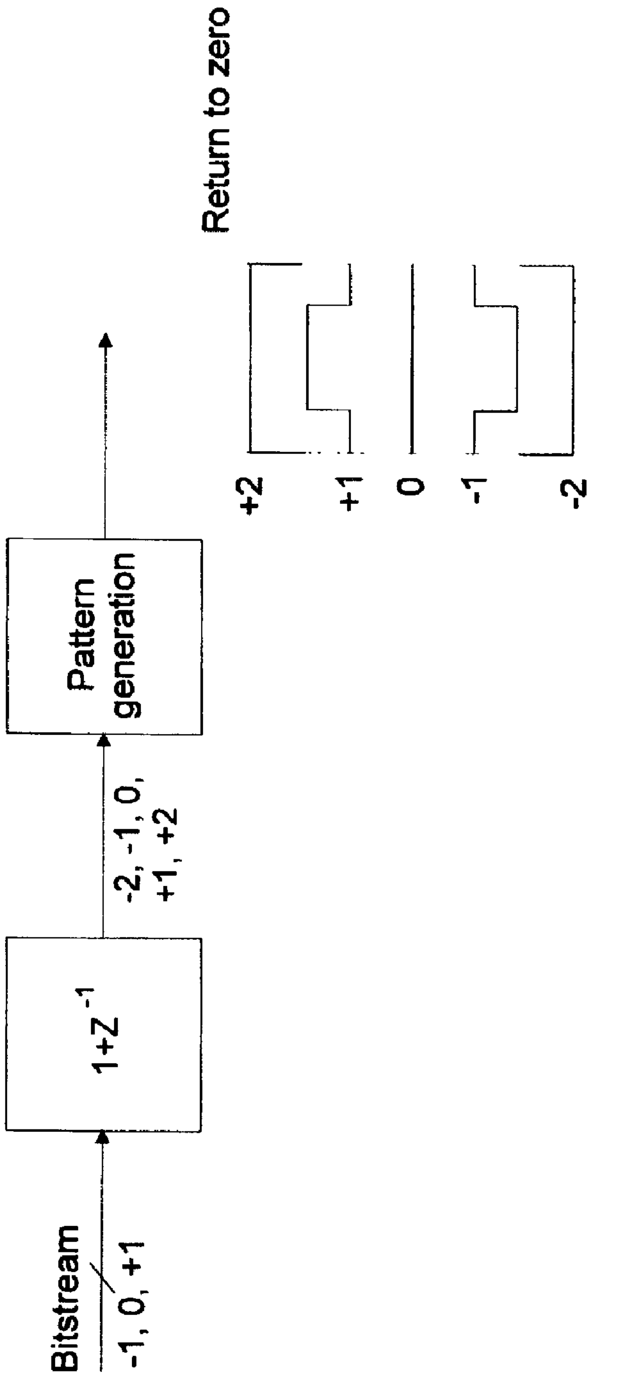
FIG. 2 shows the principles of the preferred level dependent Return-to-Zero modulation scheme.

The present invention also provides a compensation scheme for compensation for non-linear conversion of output pulses in the H-bridge into low frequency signals. This is illustrated in FIG. 2.

The H-bridge conversion of pulses into low frequency signals is distorted by non-zero rise and fall times of the H-bridge. Ideally, two pulses directly after each other should have twice the energy of a single pulse. However, nonzero rise and fall times of the transistors will add energy to the pulses but the energy is only added once. To a series of two subsequent pulses the extra energy is only added once and not twice, therefore the energy representation of each pulse becomes incorrect. In other words, the conversion is non-linear. This non-linearity can be compensated by adding Return-To-Zero (RTZ) states. This, though, has the effect that maximum output power delivered from the H-bridge will be reduced. Another idea is to apply a RTZ scheme which is dependent on the input signal level. The idea is the following: for small signal levels a RTZ scheme is applied and for high signal levels, the RTZ is abandoned. An example of how to implement a level dependent RTZ scheme is to use a very simple filter to filter the output signal and consequently convert the output from the filter into a pattern of pulses with RTZ states. An example of such a filter and a RTZ scheme is shown in FIG. 2. The filter may be extended to involve more states, as an example: $1+Z^{-1}+Z^{-2}$ giving output states from −3 to +3. The pattern generator must then be adapted to receive these levels. Basically it is only the clock frequency that sets the limit to the possible number of states. The principle can be extended to combine a multibit sigma-delta modulation with more states than the simple filter and subsequent conversion of these states into patterns with RTZ. However, this does not provide significant improvements over the simple scheme with a three-level modulator and it has disadvantages regarding increased complexity and a much higher clock frequency of the resulting output signal of the H-bridge.

The coding of the output signal can also be used both for feed-forward compensation as well as feedback compensation of non-idealities in the analog domain. I.e. the n-level output from the modulator (or from a subsequent filter) can be coded as a pseudo multibit signal by dividing each clock sample of the output signal into more clock samples. I.e. a multibit signal can thus be represented as a series of +1, 0 and −1 at a higher clock frequency. Representing a multibit signal in this way is inefficient as it requires a relatively high clock frequency in order to achieve a reasonable resolution. Different coding of the multibit output opens up the possibility of making a compensation of the number of falling and rising edges of the output signal. E.g. a feedback system can count the numbers of falling and rising edges and assure that they are equal by controlling the coding of the pseudo multibit scheme. E.g. a zero can be implemented both as two zeroes after each other, as a −1 followed by a +1 or as a +1 followed by a −1. The energy of these three ways of coding a zero are in theory the same. But in practice there will be small differences dependent of the number of rising and falling edges which easily are seen not to be equal in the three cases. The coding of a zero as a +1 followed by a −1 (or −1, +1) within the same clock period can also be used to drive a two level H-bridge in a pseudo three-level mode.

All of the above-mentioned advantages also apply for the level dependent return to zero coding. However, the implementation is much simpler than the pseudo multibit solution.

The present invention also provides a three-level H-bridge driving a miniature loudspeaker. An H-bridge consists of four switches connecting the loudspeaker to the power supply (VDD) or ground (GND) thus it is possible to connect the loudspeaker to the power supply and ground in four different ways generating 3 different voltage levels across the loudspeaker: −VDD, 0, and +VDD. The three-level H-bridge is a necessary condition if a three-level sigma-delta modulation scheme is to be used and at the same time using a low clock frequency. The three-level H-bridge can be implemented with very little extra complexity compared to the normal 2 level H-bridge.

The present invention further provides a miniature loudspeaker assembly where the active signal processing parts are arranged inside the miniature loudspeaker thus providing a miniature loudspeaker assembly with minimal emission of and susceptibility to EMI. Digital signals are known to be very insensitive to EMI but also significant emitters of EMI if signal wires are long, edges are sharp and large currents are conveyed. If the loudspeaker casing is made by electrically conductive material such as metal, or any other material shielding against EMI, then all analog connections to the active signal processing part are effectively shielded against EMI. Connection wires to the loudspeaker are kept short in the described miniature assembly and well shielded towards the surroundings. The digital interface to the chip can then be brought outside the casing without deteriorating the low susceptibility towards EMI. The main connections to the outside world being susceptible to EMI are the power supply lines, VDD and GND. They can be effectively shielded against EMI by introducing a decoupling capacitor on the power supply lines outside the loudspeaker casing, or even better inside the loudspeaker casing. Also a power supply regulator or a feedback loop placed inside the loudspeaker casing can help suppress the unwanted EMI.

The feedback signal can by example be measured as the voltage on the output of the H-bridge, the current flowing in the load, the charge delivered to the load. Or it can be other control signals like the jitter on the clock or the noise on the power supply. There are many possible ways of applying feedback. The width of the pulses can be controlled. The feedback control signal can be converted into a digital signal (one bit or multibit) and applied before the digital modulator, after the modulator or in the multibit coding block.

In order to build the active signal processing parts inside the miniature loudspeaker it is paramount that the active signal processing parts are as small as possible. As the three-level modulator scheme with a three-level H-bridge has a low complexity and furthermore requires a minimum of external components, then it is very suited for complete integration into the miniature speaker. In some cases the external output filter can even be completely eliminated, then it is very suited for complete integration into the miniature loudspeaker.

The miniature loudspeaker may for example be an electrodynamic loudspeaker or a loudspeaker based a piezo driving principle. In case of a piezo loudspeaker an analog filter comprising a low pass filter has to be inserted between the H-bridge output and the loudspeaker. The reason for this is that a piezo loudspeaker acts as a quite large capacitive load for the H-bridge. As the output signal from the H-bridge contains a large portion of high frequency noise then the efficiency would be quite poor if this high frequency noise was not removed. The analog filter can be a simple passive filter such as a coil connected in series with the loudspeaker. If preferred, the filter may comprise active components. In some cases it may also be interesting to include a filter if an electrodynamic loudspeaker is used.

The driver interface may be implemented so as to receive an analog or a digital input signal. In case of a digital interface the modulator circuit can be implemented so as to function with a digital input signal. In case of an analog interface it is possible to implement the modulator circuit so that it can function without the need for a separate analog-to-digital converter. If preferred, it is possible to include an analog-to-digital converter either integrated with the interface or connected between the interface and the modulator. The described embodiments are based on digital implementations but the principles apply for analog implementations as well.

The present invention also provides a miniature loudspeaker assembly where the active signal processing circuit is implemented as a single ASIC (application specific integrated circuit) with all functions both analog as well as digital. In order to obtain minimum cost it is important that the total chip area implementing the active signal processing circuit is as small as possible. This is obtained by implementing every part of the active circuit on one chip. Furthermore the performance of the analog parts of the active signal processing parts are much improved by integrating everything on one chip. E.g. if the transistors in the H-bridge are not matched very well then the output of the H-bridge will inevitably be deteriorated. Good matching can be achieved by putting these devices on the same chip. Also parasitic capacitive loading of signals are generally much better controlled on a chip. This also has an impact on the performance in a positive direction. By implementing all analog function blocks on the same IC as the digital parts it is assured that only a minimum of analog connections are brought outside the chip. This will be beneficial for the suppression of EMI. Even though the active signal processing parts can be built into the loudspeaker, thus shielding it from EMI, this shielding will never be complete. There are measures to shield signals coming from outside the chip against EMI, for example RC-filters, feedback etc.

A miniature loudspeaker assembly comprising a driver according to the invention described above, and a loudspeaker may be applied in a number of applications within many different fields. One field of interest is mobile devices. The mobile devices could be: mobile phones, hearing aids, assistive listening devices, head-sets, palm computers, or laptop computers.

The invention claimed is:

1. A miniature loudspeaker assembly comprising:

a loudspeaker casing made in an EMI shielding material, the loudspeaker casing comprising:

a digital interface adapted to receive a digital input signal, a three-level sigma-delta modulator adapted to receive the digital input signal and provide a three-level PDM signal, a correction circuit comprising a filter adapted to convert the three-level PDM signal into a pattern of pulses with five or more states, a pattern generator adapted to convert the pattern of pulses into a pattern of pulses with level dependent RTZ states, and a loudspeaker comprising a motor adapted to receive the pattern of pulses with level dependent RTZ states, the motor further being adapted to drive a diaphragm so as to generate an acoustical signal.

2. The miniature loudspeaker assembly of claim 1, wherein the digital interface is adapted to receive and process signal formats selected from the group consisting of: SPDIF, AES/EBU, PCM, SSI and $I^2S$.

3. The miniature loudspeaker assembly of claim 2, further comprising a three-level H-bridge comprising at least 4 switches for providing independent control.

4. A mobile device comprising the miniature loudspeaker assembly of claim 3.

5. The mobile device of claim 4, wherein the mobile device is selected from the group consisting of: mobile phones, hearing aids, assistive listening devices, head-sets, palm computers, and laptop computers.

6. A mobile device comprising the miniature loudspeaker assembly of claim 2.

7. The mobile device of claim 6, wherein the mobile device is selected from the group consisting of: mobile phones, hearing aids, assistive listening devices, head-sets, palm computers, and laptop computers.

8. The miniature loudspeaker assembly of claim 1, further comprising a three-level H-bridge comprising at least 4 switches for providing independent control.

9. A mobile device comprising the miniature loudspeaker assembly of claim 8.

10. The mobile device of claim 9, wherein the mobile device is selected from the group consisting of: mobile phones, hearing aids, assistive listening devices, head-sets, palm computers, and laptop computers.

11. A mobile device comprising the miniature loudspeaker assembly of claim 1.

12. The mobile device of claim 11, wherein the mobile device is selected from the group consisting of: mobile phones, hearing aids, assistive listening devices, head-sets, palm computers, and laptop computers.

* * * * *

UNITED STATES PATENT AND TRADEMARK OFFICE

CERTIFICATE OF CORRECTION

PATENT NO. : 7,336,794 B2
APPLICATION NO. : 10/307290
DATED : February 26, 2008
INVENTOR(S) : Claus Erdmann Fürst et al.

It is certified that error appears in the above-identified patent and that said Letters Patent is hereby corrected as shown below:

Title Page;

Please add the following U.S. Priority Data to page 1:

Related U.S. Application Data

(60) Provisional application No. 60/334,358, filed on Nov. 30, 2001.
Provisional application No. 60/404,289, filed on Aug. 20, 2002.

Signed and Sealed this

Twelfth Day of August, 2008

JON W. DUDAS
*Director of the United States Patent and Trademark Office*